(12) United States Patent
Singh et al.

(10) Patent No.: US 6,707,721 B2
(45) Date of Patent: Mar. 16, 2004

(54) LOW POWER MEMORY DESIGN WITH ASYMMETRIC BIT LINE DRIVER

(75) Inventors: Gajendra Singh, Sunnyvale, CA (US); Aparna Ramachandran, Santa Clara, CA (US); Miao Rao, San Jose, CA (US); Shree Kant, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 36 days.

(21) Appl. No.: 10/097,973

(22) Filed: Mar. 13, 2002

(65) Prior Publication Data

US 2003/0174535 A1 Sep. 18, 2003

(51) Int. Cl.$^7$ ................................................. G11C 7/00
(52) U.S. Cl. ................... 365/189.05; 365/154; 365/196
(58) Field of Search ............................ 365/189.05, 154, 365/196

(56) References Cited

U.S. PATENT DOCUMENTS

| | | | |
|---|---|---|---|
| 5,616,948 A | * | 4/1997 | Pfiester ........................ 257/412 |
| 5,673,230 A | * | 9/1997 | Kuriyama .................... 365/203 |
| 6,141,744 A | * | 10/2000 | Wing So ....................... 712/35 |
| 6,512,712 B1 | * | 1/2003 | Desai et al. ................. 365/203 |
| 6,522,594 B1 | * | 2/2003 | Scheuerlein ................ 365/206 |
| 2002/0016579 A1 | * | 2/2002 | Stenberg ..................... 604/361 |

* cited by examiner

*Primary Examiner*—Viet Q. Nguyen
(74) *Attorney, Agent, or Firm*—Rosenthal & Osha L.L.P.

(57) ABSTRACT

A register file design having an asymmetric bit line driver is provided. More specifically, the register file design uses a memory element that has a footer device that facilitates the discharge/charging of a bit line through a pass device, where a width of the footer device is greater than a width of the pass device. Further, a method for performing low power memory operations using asymmetric bit line drivers is provided.

23 Claims, 3 Drawing Sheets

LOW POWER MEMORY DESIGN WITH ASYMMETRIC BIT LINE DRIVER

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (12). The microprocessor (10) has, among other things, a central processing unit (also known and referred to as "CPU" or "execution unit") (14) and a memory controller (also known as "load/store unit") (16). The CPU (14) is where the actual arithmetic and logical operations of the computer system take place. To facilitate the execution of operations by the CPU (14), the memory controller (16) provides the CPU (14) with necessary instructions and data from the memory (12). The memory controller (16) also stores information generated by the CPU (14) into the memory (12).

Memory, as shown in FIG. 1, is typically formed by numerous storage cells, where each storage cell contains a bit of data. Memory organized in such a fashion is called a "memory array." The data in each storage cell can have either a logic low value, i.e., '0,' or a logic high value, i.e., '1.' As a result, the value(s) of one or more storage cells are often used to represent numbers, characters, instructions, etc. Accordingly, to ensure that data in a storage cell is properly read and stored, important consideration must be afforded to how a memory array is designed.

FIG. 2 shows a typical implementation of a memory array (20). The memory array (20) has numerous storage cells (also known and referred to as "memory elements," "memory cells," and "register file cells") (36), where each storage cell (36) is connected to a bit line (also known as "row line") (40) and a word line (also known as "column line") (42). Word lines (42) are selected using a row decoder (32) that drives a particular word line (42) using a word line driver (34). Bit lines (30) are selected using a column decoder (30), where a value on a bit line (40) is driven to a sense amplifier (44) by a bit line driver (38). A storage cell (36) is selected for a read/write operation by some combination of activating the bit line (40) connected to the storage cell (36) and activating the word line (42) connected to the storage cell (36).

Accurately and quickly reading data from a memory array, such as the one shown in FIG. 2, is challenging because of both large physical sizes of the memory array and a high number of entries, i.e., storage cells, in the memory array.

FIG. 3 shows a typical implementation of a storage cell (36). One technique used by designers to increase read operation performance is to use a pre-charge device (50) to pre-charge a bit line (40) to a logic high value, i.e., '1,' prior to a read operation (also referred to as "pre-charge phase"), and then to perform, i.e., evaluate, the read operation (also referred to as "evaluation phase") on the storage cell (36) by allowing the bit line (40) connected to the particular storage cell (36) to discharge if the particular storage cell (36) holds a '0' value. If, however, the bit line (40) does not discharge, it implies that the particular storage cell (36) connected to the bit line holds a '1' value.

Still referring to FIG. 3, during a read operation, a pass device (48) is switched 'on' by some input at its gate terminal. If the storage cell (36) holds a '0' value, then a footer device (46), which has one terminal connected to ground, is 'on' causing the bit line (40) to discharge through the 'on' pass and footer devices (48, 46).

In attempting to increase the speed of storage cell access, designers have increased the size of the pass device (shown in FIG. 3) to add drive strength to the storage cell. However, increasing the pass device size also increases the capacitance on the bit line to which the pass device is connected. Such an increase in bit line load slows down storage cell access. Thus, the net gain in speed due to increasing the pass device size is much smaller in proportion to the increase in the size of the pass device. Further still, the increase in size of the pass device leads to increased power consumption, which is in proportion to the increase in size of the pass device. Accordingly, an incremental gain in pass device size causes a corresponding increase in power consumption. Thus, there is a need for a memory design that has low power consumption without a loss in storage cell access speed.

SUMMARY OF THE INVENTION

According to one aspect of the present invention, an integrated circuit that has a memory comprises a bit line and a storage cell connected to the bit line, where the storage cell comprises a pass device connected to the bit line and a footer device connected to the pass device, where the footer device facilitates driving the bit line through the pass device based on a value stored in the storage cell, and where the pass device and the footer device are asymmetric.

According to another aspect, an integrated circuit comprises storing means for storing a value, propagating means for propagating the value from the storing means, a first driver means for driving the propagating means, and a second driving means for driving the propagating means, where the first driver means and the second driver means are asymmetric.

According to another aspect, a method for performing memory operations in an integrated circuit comprises: storing a value in a memory element, where the memory element is connected to a bit line; and facilitating driving the bit line through a pass device and a footer device based on the value stored in the memory element, where the pass device and the footer device are asymmetric.

Other aspects and advantages of the invention will be apparent from the following description and the appended claims.

DETAILED DESCRIPTION

Embodiments of the present invention relate to a memory design that uses an asymmetric bit line driver. Embodiments of the present invention further relate to a method for performing memory operations using an asymmetric bit line driver.

Particularly, the present invention, as will be shown by the embodiments discussed below, uses a storage cell that employs a footer device to facilitate a discharge/charging of a bit line through a pass device, where the pass device is connected to the bit line, and where a width of the footer device is greater than a width of the pass device. Using the present invention, power consumption may be reduced without decreasing storage cell access speed. Alternatively, in some embodiments, storage cell speeds may be increased without increasing power consumption.

Figure 1:
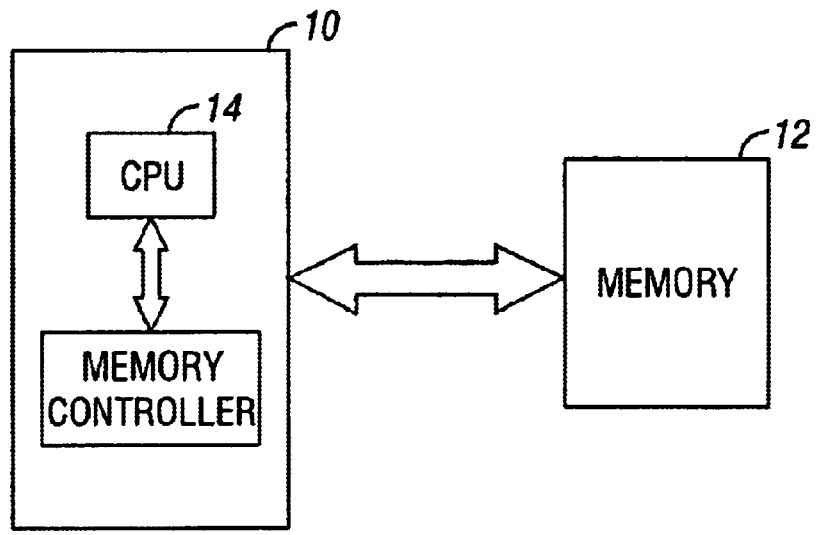
FIG. 1 shows a typical prior art computer system.
Figure 2:
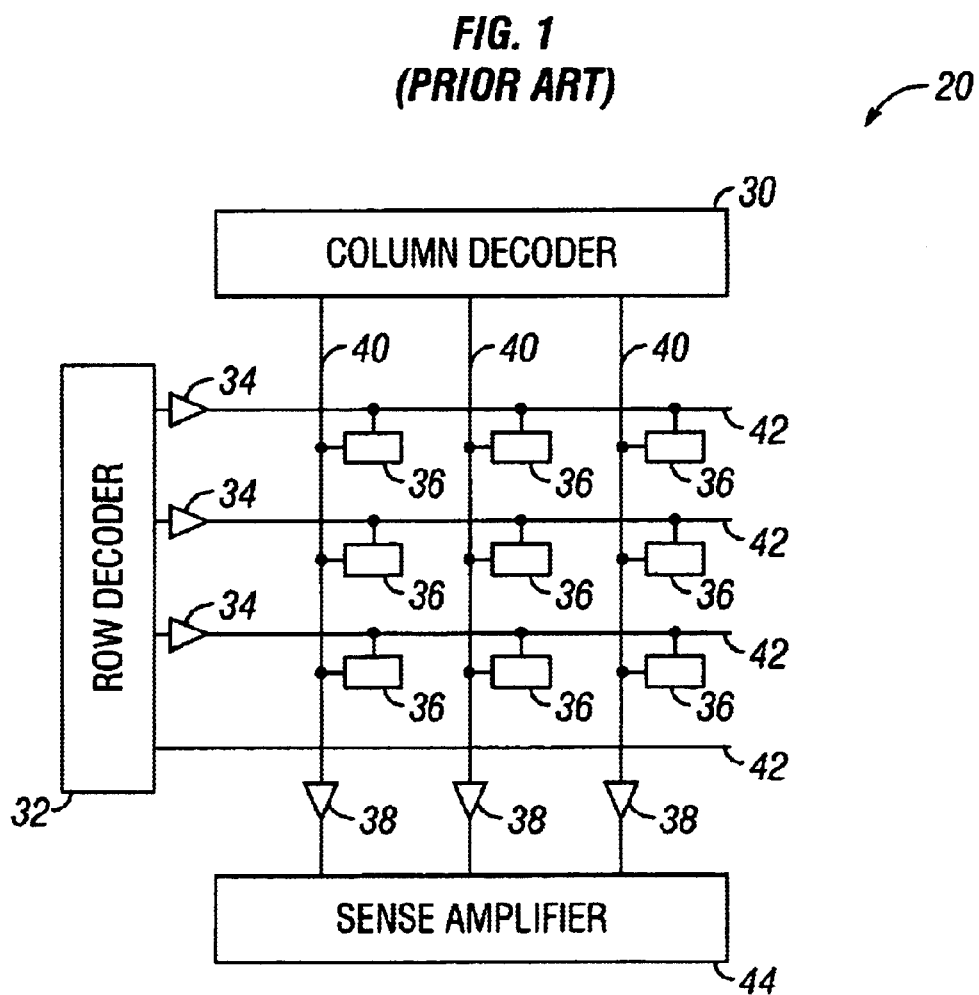
FIG. 2 shows a typical memory array.
Figure 3:
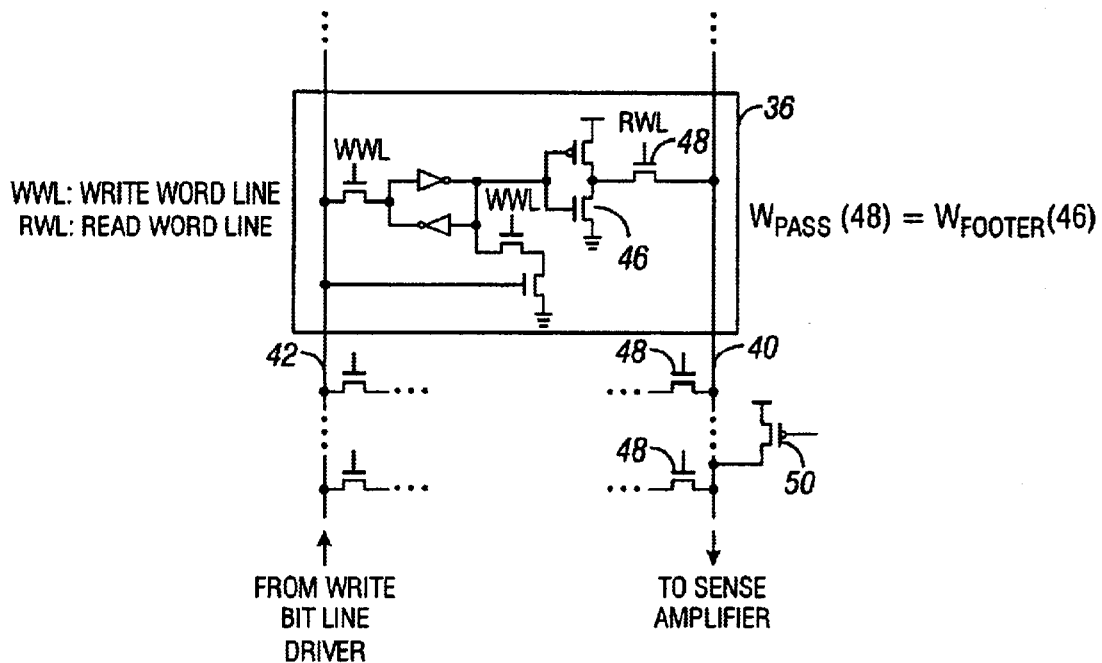
FIG. 3 shows a typical storage cell.
Figure 4:
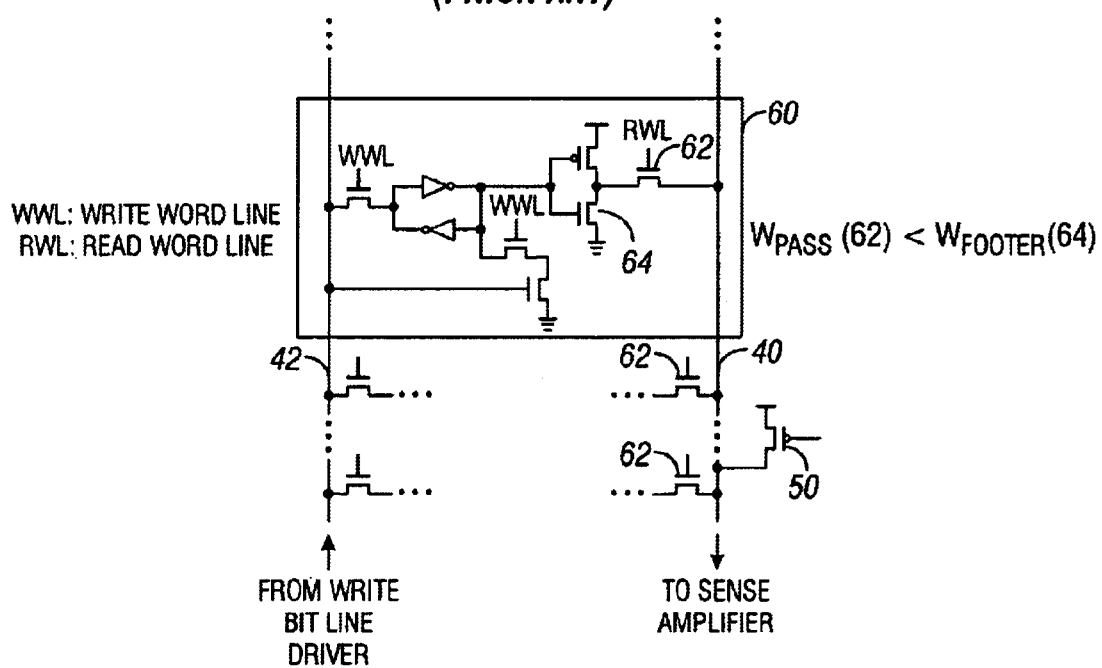
FIG. 4 shows a storage cell in accordance with an embodiment of the present invention.

FIG. 4 shows a storage cell (60) in accordance with an embodiment of the present invention. In FIG. 4, a pass device (62) connected to a bit line (40) is used to pass a value stored in the storage cell (60) to the bit line (40) during a storage cell access. In the case of precharge logic, i.e., where the bit line (40) is precharged to a particular high voltage value by a precharge device (50) prior to the access of the stored value in the storage cell (60), a footer device (64) is used to facilitate the discharge of the bit line (40) through the pass device (62) if the value stored in the storage cell (60) is low.

As indicated in FIG. 4, a width of the footer device (64) is greater than a width of the pass device (62). In other words, relative to typical storage cell implementations, the size of the footer device (64) is increased while the size of the pass device (62) is decreased. It follows that the speed of a read access is increased by the increase in size of the footer device (64) while the load on the bit line (40) due to the capacitance of the drain of the pass device (62) is decreased, effectively leading to lower power consumption. In other words, those skilled in the art will appreciate that by reducing the drain capacitance of the pass device (62), the power consumption during a read access is appreciably decreased.

Figure 5:
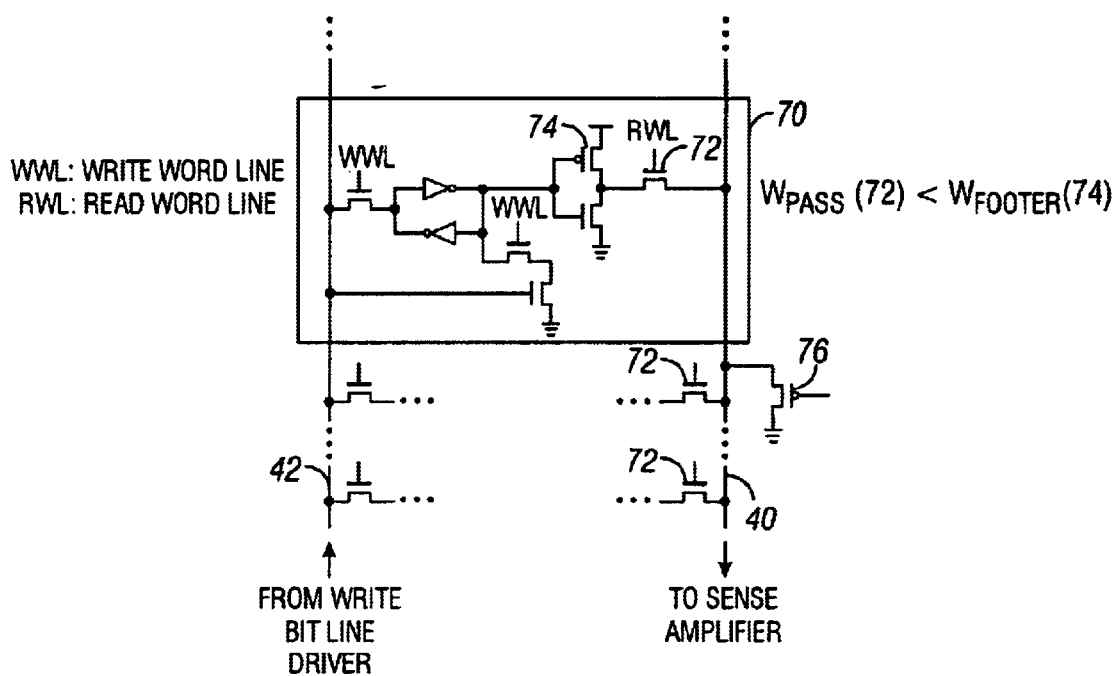
FIG. 5 shows a storage cell in accordance with another embodiment of the present invention.

FIG. 5 shows a storage cell (70) in accordance with another embodiment of the present invention. In FIG. 5, a pass device (72) connected to a bit line (40) is used to pass a value stored in the storage cell (70) to the bit line (40) during a storage cell access. In the case of predischarge logic, i.e., where the bit line (40) is discharged to a particular low voltage value by a discharge device (76) prior to the access of the stored value in the storage cell (70), a footer device (74) is used to facilitate the charging of the bit line (40) through the pass device (72) if the value stored in the storage cell (70) is high.

As indicated in FIG. 5, a width of the footer device (74) is greater than a width of the pass device (72). In other words, relative to typical storage cell implementations, the size of the footer device (74) is increased while the size of the pass device (72) is decreased. It follows that the speed of a read access is increased by the increase in size of the footer device (74) while the load on the bit line (40) due to the capacitance of the drain of the pass device (72) is decreased, effectively leading to lower power consumption. In other words, those skilled in the art will appreciate that by reducing the drain capacitance of the pass device (72), the power consumption during a read access is appreciably decreased.

Those skilled in the art will appreciate that the differently sized pass and footer transistors are referred to as forming an "asymmetric bit line driver." Further, those skilled in the art will understand that the term "memory element" is synonymous with the terms "storage cell," "memory cell," and "register file cell." Further, those skilled in the art will appreciate that although the present invention refers to a storage cell in a memory array, the present invention may be used in various implementations, such as register files, random access memory, cache memory, etc.

Advantages of the present invention may include one or more of the following. In some embodiments, because an asymmetric bit line driver is used in a memory element, access speeds may be increased without increasing power consumption during a read operation.

In some embodiments, because an asymmetric bit line driver is used in a memory element, power consumption may be reduced without a loss of storage cell access speed.

In some embodiments, because an asymmetric bit line driver is used in a memory element, charge sharing between a bit line and an intermediate node between a pass transistor and a footer transistor is mitigated. Such mitigation of charge sharing leads to improved memory performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a memory, the memory comprising:
  a bit line; and
  a storage cell connected to the bit line, the storage cell comprising:
    a pass device connected to the bit line; and
    a footer device connected to the pass device, wherein the footer device facilitates driving the bit line through the pass device based on a value stored in the storage cell,
    wherein the pass device and the footer device are asymmetric.

2. The integrated circuit of claim 1, wherein a width of the footer device is greater than a width of the pass device.

3. The integrated circuit of claim 1, wherein the footer device facilitates the discharge of the bit line during a read operation.

4. The integrated circuit of claim 1, wherein the footer device facilitates the charging of the bit line during a read operation.

5. The integrated circuit of claim 1, wherein the value stored in the storage cell is translated to the bit line during a read operation.

6. The integrated circuit of claim 5, the memory further comprising:
  a precharge device that precharges the bit line to a particular voltage value before the value stored in the storage cell is translated to the bit line.

7. The integrated circuit of claim 5, the memory further comprising:
  a discharge device that discharges the bit line to a particular voltage value before the value stored in the storage cell is translated to the bit line.

8. The integrated circuit of claim 1, wherein the pass device is an n-type device.

9. The integrated circuit of claim 1, wherein the footer device is a p-type device.

10. The integrated circuit of claim 1, wherein the pass device is a p-type device.

11. The integrated circuit of claim 1, wherein the footer device is an n-type device.

12. An integrated circuit, comprising:

storing means for storing a value;

propagating means for propagating the value from the storing means;

a first driver means for driving the propagating means; and a second driving means for driving the propagating means, wherein the first driver means and the second driver means are asymmetric.

13. A method for performing memory operations in an integrated circuit, comprising:

storing a value in a memory element, wherein the memory element is connected to a bit line; and facilitating driving the bit line through a pass device and a footer device based on the value stored in the memory element, wherein the pass device and the footer device are asymmetric.

14. The method of claim 11, wherein a width of the footer device is greater than a width of the pass device.

15. The method of claim 11, wherein a discharge of the bit line is facilitated during a read operation.

16. The method of claim 11, wherein a charging of the bit line is facilitated during a read operation.

17. The method of claim 11, wherein the value stored in the memory element is translated to the bit line during a read operation.

18. The method of claim 17, the method further comprising:

precharging the bit line to a particular voltage value before the value stored in the memory element is translated to the bit line.

19. The method of claim 17, the method further comprising:

discharging the bit line to a particular voltage value before the value stored in the memory element is translated to the bit line.

20. The method of claim 11 wherein the pass device is an n-type device.

21. The method of claim 11, wherein the footer device is a p-type device.

22. The method of claim 11, wherein the pass device is a p-type device.

23. The method of claim 11, wherein the footer device is an n-type device.

* * * * *